United States Patent
Hauf et al.

(10) Patent No.: US 9,651,772 B2
(45) Date of Patent: May 16, 2017

(54) ARRANGEMENT FOR THE ACTUATION OF AT LEAST ONE ELEMENT IN AN OPTICAL SYSTEM

(71) Applicant: Carl Zeiss SMT GmbH, Oberkochen (DE)

(72) Inventors: Markus Hauf, Ulm (DE); Martin Latzel, Leimen (DE); Edwin Johan Buis, Belfeld (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 172 days.

(21) Appl. No.: 14/795,458

(22) Filed: Jul. 9, 2015

(65) Prior Publication Data
US 2015/0309305 A1    Oct. 29, 2015

Related U.S. Application Data

(63) Continuation of application No. PCT/EP2014/053540, filed on Feb. 24, 2014.
(Continued)

(30) Foreign Application Priority Data

Mar. 13, 2013    (DE) .......... 10 2013 204 305

(51) Int. Cl.
*G03B 27/54*    (2006.01)
*G02B 26/08*    (2006.01)
(Continued)

(52) U.S. Cl.
CPC .......... *G02B 26/0816* (2013.01); *G02B 5/09* (2013.01); *G02B 7/1815* (2013.01);
(Continued)

(58) Field of Classification Search
CPC .... G02B 26/0816; G02B 5/09; G02B 7/1815; G02B 7/1822; G03F 7/70075; G03F 7/70116; G03F 7/7015
(Continued)

(56) References Cited

U.S. PATENT DOCUMENTS

| | | |
|---|---|---|
| 6,271,976 B1 | 8/2001 | Weber |
| 6,402,329 B1 | 6/2002 | Bailly et al. |

(Continued)

FOREIGN PATENT DOCUMENTS

| | | |
|---|---|---|
| DE | 199 05 779 A1 | 8/2000 |
| DE | 20012046 | 10/2000 |

(Continued)

OTHER PUBLICATIONS

International Search Report and Written Opinion for corresponding PCT Appl No. PCT/EP2014/053540, dated May 9, 2014.
(Continued)

*Primary Examiner* — Peter B Kim
(74) *Attorney, Agent, or Firm* — Fish & Richardson P.C.

(57) ABSTRACT

An arrangement for the actuation of an element in an optical system. The arrangement includes first actuation and second actuation units for tilting the element about at least two different tilting axes. The first and second actuation units respectively include a flexure unit arranged outside an area defined by the element. Each flexure unit includes a first flexing element, rotatable with respect to a first axis of rotation, and a second flexing element, rotatable with respect to a second axis of rotation. For each flexure unit, the two associated axes of rotation intersect at a virtual connecting point of the flexure unit concerned to the optical element. The virtual connecting point is arranged in the area defined by the element and defines a rotating point for the element.

28 Claims, 4 Drawing Sheets

Related U.S. Application Data (60) Provisional application No. 61/778,810, filed on Mar. 13, 2013.

(51) Int. Cl.
*G02B 7/182* (2006.01)
*G03F 7/20* (2006.01)
*G02B 5/09* (2006.01)
*G02B 7/18* (2006.01)

(52) U.S. Cl.
CPC ......... *G02B 7/1822* (2013.01); *G03F 7/7015* (2013.01); *G03F 7/70075* (2013.01); *G03F 7/70116* (2013.01)

(58) Field of Classification Search
USPC .......................................................... 355/67
See application file for complete search history.

(56) References Cited

U.S. PATENT DOCUMENTS

| | | |
|---|---|---|
| 8,654,345 B2 | 2/2014 | Hof et al. |
| 2006/0187511 A1 | 8/2006 | Rau |
| 2006/0221473 A1 | 10/2006 | Oshima et al. |
| 2012/0067833 A1 | 3/2012 | Kugler et al. |

FOREIGN PATENT DOCUMENTS

| | | |
|---|---|---|
| DE | 102 04 249 A1 | 8/2003 |
| DE | 102008009600 | 8/2009 |
| DE | 10 2009 044 957 A1 | 4/2010 |
| DE | 102009054860 | 6/2011 |
| FR | 2 773 890 | 7/1999 |
| JP | 2002-72057 | 3/2002 |
| JP | 2012-185278 | 9/2012 |
| WO | WO 2009/100856 | 8/2009 |

OTHER PUBLICATIONS

International Preliminary Report on Patentability for corresponding PCT Appl No. PCT/EP2014/053540, dated Sep. 24, 2015.
German Office Action with English translation thereof for corresponding Appln. No. 10 2013 204 305.8, dated Nov. 7, 2013.

ARRANGEMENT FOR THE ACTUATION OF AT LEAST ONE ELEMENT IN AN OPTICAL SYSTEM

CROSS REFERENCE TO RELATED APPLICATIONS

This application is a continuation of, and claims benefit under 35 USC 120 to, international application PCT/EP2014/053540, filed Feb. 24, 2014, which claims priority of German Patent Application DE 10 2013 204 305.8 and U.S. 61/778,810, both filed on Mar. 13, 2013. The content of these applications is hereby incorporated by reference

BACKGROUND OF THE INVENTION

Field of the Invention

The invention concerns an arrangement for the actuation of at least one element in an optical system.

The arrangement according to the invention can be used advantageously in particular in optical systems with a plurality of elements (for example optical elements) that are adjustable independently of one another, for example for the actuation of a facet mirror in a microlithographic projection exposure apparatus. However, the invention is not restricted to this, but can also be used generally in other optical systems (for example optical systems for the working of materials), and in particular systems in which a plurality of elements are respectively mounted adjustably in a confined installation space.

Prior Art

Microlithography is used for the production of microstructured components, such as for example integrated circuits or LCDs. The microlithographic process is carried out in what is known as a projection exposure apparatus, which has an illumination device and a projection lens. The image of a mask (=reticle) illuminated via the illumination device is thereby projected via the projection lens onto a substrate (for example a silicon wafer) that is coated with a light-sensitive layer (photoresist) and is arranged in the image plane of the projection lens, in order to transfer the mask structure to the light-sensitive coating of the substrate.

In a projection exposure apparatus designed for EUV (i.e. for electromagnetic radiation with a wavelength below 15 nm), mirrors are used as optical components for the imaging process because of the lack of light-transmissive materials. Furthermore, in particular in the illumination device of a microlithographic projection exposure apparatus designed for operation in EUV, the use of facet mirrors in the form of field facet mirrors and pupil facet mirrors as bundle-guiding components is known, for example from DE 10 2008 009 600 A1. Such facet mirrors are made up of a multiplicity of individual mirrors that are respectively designed to be tiltable via flexures for the purpose of adjustment or for realizing certain distributions of the illumination angle. At the same time, there is also a need to realize tilting about two tilting axes (in particular perpendicular to one another).

A problem that arises here in practice is that, for actuating the individual mirrors of a facet mirror for instance (or other elements in arrangements in which these elements are comparatively closely packed), only a confined installation space is available. In this space it is necessary on the one hand to realize joints that flex as much as possible—in order to minimize the forces on the actuator—and on the other hand often also to dissipate thermal loads acting on the facet—for instance during operation of the projection exposure apparatus. In particular in applications in which comparatively large tilting angles (in the case of the individual mirrors of a facet mirror for example of over 30 mrad) are to be realized, the aforementioned boundary conditions present demanding challenges for the design of the joints. In this respect, the limited installation space in the case of a facet mirror for instance presents a problem to the extent that, when actuating the individual mirrors, it is intended to avoid their rotation about the mirror axis (perpendicular to the respective mirror plane) and an accompanying collision of the individual mirrors, generally via additional measures in the structural design.

As prior art, reference is made, only by way of example, to DE 199 05 779 A1 and DE 10 2009 044 957 A1.

SUMMARY OF THE INVENTION

An object of the present invention is to provide an arrangement for the actuation of at least one element in an optical system that makes it possible also to realize relatively large tilting angles with comparatively little installation space.

This object is achieved by the arrangement according an arrangement for the actuation of at least one element in an optical system. The arrangement has a first actuation unit and a second actuation unit for tilting the element about at least two tilting axes that are different from one another. The first actuation unit and the second actuation unit respectively have a flexure unit, which is arranged outside an area defined by the element. Each of these flexure units has a first flexing element, rotatable with respect to a first axis of rotation, and a second flexing element, rotatable with respect to a second axis of rotation. For each of the flexure units, the two associated axes of rotation intersect at a virtual connecting point of the flexure unit concerned to the optical element, this virtual connecting point being arranged in the area defined by the element and defining a rotating point for the element.

An arrangement according to the invention for the actuation of at least one element in an optical system, the arrangement having a first actuation unit and a second actuation unit for tilting the element about at least two tilting axes that are different from one another,

- wherein the first actuation unit and the second actuation unit respectively have a flexure unit, which is arranged outside an area defined by the element;
- wherein each of these flexure units has a first flexing element, rotatable with respect to a first axis of rotation, and a second flexing element, rotatable with respect to a second axis of rotation; and
- wherein, for each of the flexure units, the two associated axes of rotation intersect at a virtual connecting point of the flexure unit concerned to the optical element, this virtual connecting point being arranged in the area defined by the element and defining a rotating point for the element.

For the purposes of the present application, a "virtual connecting point" of the flexure unit concerned to the optical element should be understood as meaning a point at which there is no physical mechanical connection, but which only provides the functionality (that is here the provision of a rotating point for the element), the actual physical mechanical connection taking place elsewhere (in particular outside the area defined by the element).

The invention is based in particular on the concept of realizing tilting movements about two tilting axes that are different from one another (in particular perpendicular to one another) in the actuation of elements, such as for example the individual mirrors of a facet mirror, in such a way that, although these tilting axes lie in the area defined by the element (for example in the facet plane of the facet mirror concerned), this is without requiring placement of the mechanical connecting points of the actuation units in this area (which under some circumstances, as still to be explained below, is not directly accessible at all for a mechanical connection of flexure units or the like). Rather, the flexing elements of the flexure units in the actuation units themselves, serving for the tilting, are arranged outside the area defined by the element, whereas only a virtual connecting point of the actuation units, in the sense described above, respectively lies in the area defined by the element.

As a result, for example, as explained still more specifically below, the effect of a ball joint is achieved at the virtual connecting point, though avoiding the placement of such a ball joint in the area of the element and also the space requirement that such a ball joint involves.

Furthermore, as likewise explained still more specifically, the present invention comprises the concept of achieving a desired blocking of the rotational movement about a further axis (for example in the case of a facet mirror about the mirror axis perpendicular to the respective mirror plane), i.e. the fixing of what is known as the Rz degree of freedom describing a rotation about the z axis, already as a direct consequence of the mechanism according to the invention itself, and consequently without requiring additional blocking elements and the additional stiffnesses they involve, whereby a considerable saving of installation space can be achieved.

In this respect, the invention makes use in particular of the fact that, in an optical system with a plurality of elements that are adjustable independently of one another, such as for example a facet mirror, only two tilting movements that are independent of one another (corresponding to the degrees of freedom Rx and Ry, which respectively describe the rotation about the x axis and the y axis) are of interest or desired, while, given a suitable design of the arrangement, the other degrees of freedom can be used according to the invention specifically such that the realization of the desired tilting movements (i.e. an actuation in the degrees of freedom Rx and Ry) is specifically accompanied by a fixing in the further degree of freedom Rz. In this respect, the invention comprises in particular the concept of first achieving a fixing in two degrees of freedom via a supporting unit in such a way that, of the remaining (four) degrees of freedom, only two, that is the degrees of freedom Rx and Ry concerning the rotation about the x axis or y axis, still remain actively set or actuable.

The invention is not restricted to the actuation of optical elements. Rather, the invention can also be used in further embodiments for the actuation of other elements, such as for example sensors.

According to one embodiment, the first flexing element is formed as a leaf spring element. Such leaf spring elements have the advantage that they can on their own already provide torsional functionality, which, as explained below, is required in the mechanism according to the invention on the part of the actuation units. However, the leaf spring elements may also be equipped with a flexure unit (an additional flexure unit) for the provision of the rotational or torsional functionality.

According to one embodiment, the first flexing element has a first hinge joint.

According to one embodiment, in a prescribed position of the element, the first axis of rotation runs perpendicularly to the area defined by the element.

According to one embodiment, the second flexing element is formed as a leaf spring element.

According to one embodiment, the second flexing element has a second hinge joint.

According to one embodiment, in a prescribed position of the element, the second axis of rotation runs at an angle $\alpha$ to the area defined by the element, where $0<\alpha<90°$.

According to one embodiment, the two tilting axes are perpendicular to one another.

According to one embodiment, the arrangement also has a supporting unit, which is articulated on the element at a flexure point.

According to one embodiment, the first actuation unit, the second actuation unit and the supporting unit are configured in such a way that a translational movement of one of the actuation units respectively is accompanied by a tilting movement of the element about a tilting axis, which is defined by the virtual connecting point of the other actuation unit, respectively, and the flexure point of the supporting unit.

According to one embodiment, the flexure point of the supporting unit in each case remains locationally fixed.

According to one embodiment, the supporting unit is formed as a bipod, which has two fixed bipod struts. By this approach, a fixing of the (for example optical) element in two degrees of freedom can already be achieved in a simple way, it being possible for the flexure point that is assigned to the supporting unit and remains locationally fixed to be defined by the strut head of the two bipod struts.

According to another embodiment, the supporting unit is formed as a tripod, which has three fixed struts.

According to one embodiment, the supporting unit has at least one cooling channel for a cooling fluid (for example water). The supporting unit can thus additionally serve for transporting the cooling fluid to the respective (for example optical) element (for example the individual mirror of the facet mirror).

According to one embodiment, the arrangement also has a guide for the respective flexing element, which is configured in such a way that the guide optionally brings about a linear or arcuately curved path of movement of the respective flexing element. Such a "switchable" guide with respect to the path of movement of the respective flexing element has the advantage that, after completion of the design of the respective optical system, the compensation of any existing parasitic movements (for example of the individual mirror concerned within the facet mirror) can still be achieved in a simple way, without having to intervene once again in the fundamental design of the optical system. In this respect, the guide may have in particular—as explained still more specifically below—two length-variable flexure struts for modifying the path of movement of the respective flexing element.

According to one embodiment, the optical system has a plurality of elements that are adjustable independently of one another. In this case, the advantages achieved according to the invention with regard to the in many applications relatively "close packing" of the individual (for example optical) elements (for instance the individual mirrors of a facet mirror) particularly come to bear.

According to one embodiment, the optical system is therefore a facet mirror, in particular a field facet mirror.

The invention also concerns a projection exposure apparatus with an arrangement according to the invention. The projection exposure apparatus may be designed in particular for operation in EUV.

Further configurations of the invention can be taken from the description and the subclaims.

The invention is explained in more detail below on the basis of preferred exemplary embodiments with reference to the accompanying figures.

DETAILED DESCRIPTION OF PREFERRED EMBODIMENTS

The concept underlying the invention is explained below with reference to FIG. 1-3. It should be pointed out here that the basic diagrams in FIG. 1 and FIG. 2 serve only for explaining the functionality to be achieved by the arrangement according to the invention and also for explaining the problems arising in realizing this and individual thought processes on the way to realizing the concept according to the invention, whereas one possible realization of the invention is described on the basis of FIG. 3.

Figure 1:
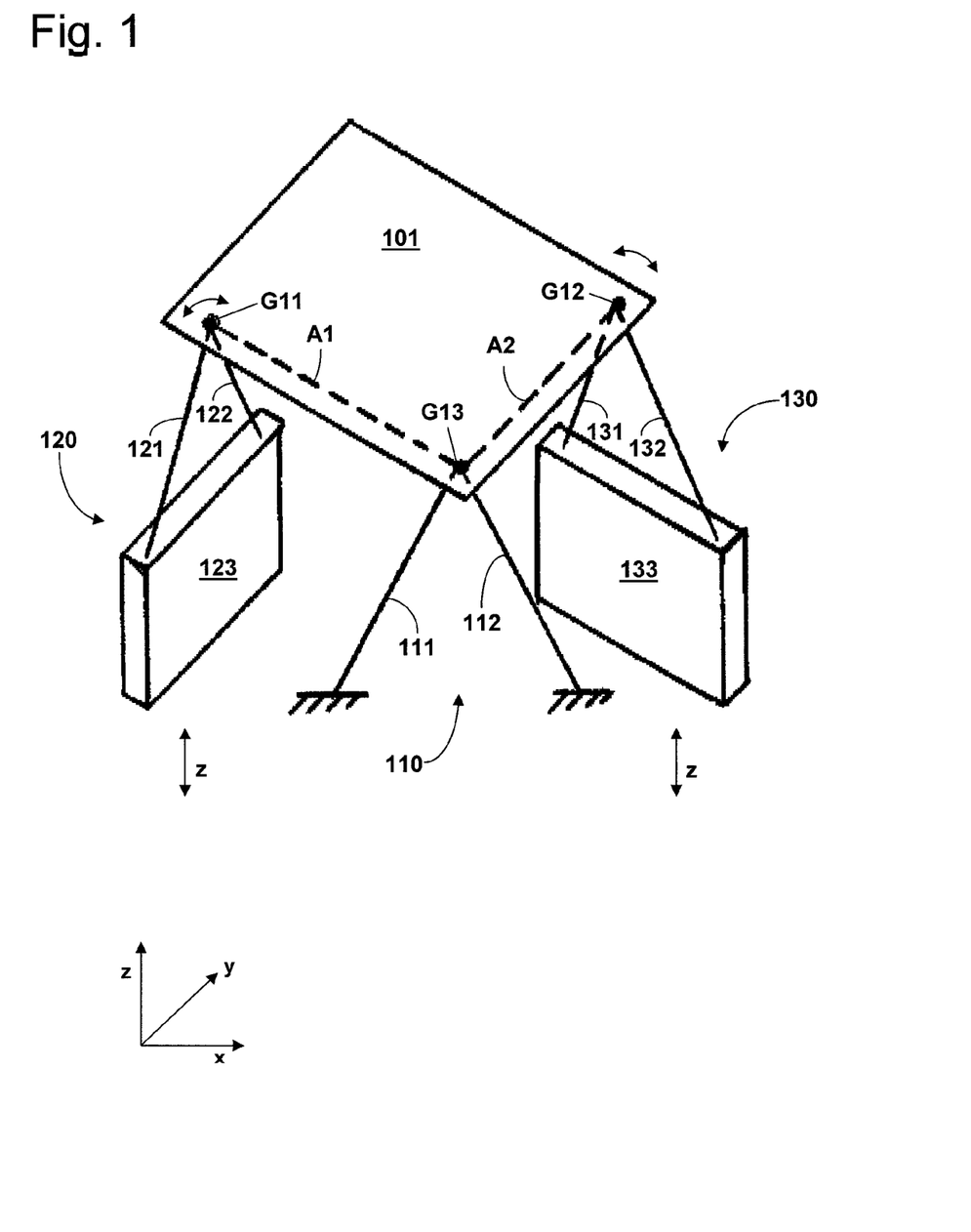
FIG. 1 shows a schematic representation for explaining the concept according to the invention on the basis of a first embodiment.

According to the basic diagram of FIG. 1, an arrangement for the actuation of an element comprises two actuation units, which in the exemplary embodiment are respectively configured as bipods 120 and 130. A further bipod 110 with two fixed bipod struts 111, 112 serves for the additional positional determination of the optical element 101 and is therefore referred to hereinafter as the supporting unit. Instead of the bipod 110, a tripod with three fixed bipod struts may also be provided. The aforementioned bipods 120 and 130, forming the two actuation units, respectively have in the basic diagram of FIG. 1 bipod struts 121, 122 and 131, 132, which are adjustable in pairs (i.e. within the same bipod 120 or 130). In fact, according to FIG. 1, the bipod struts 121, 122 and 131, 132 respectively have a constant length and are displaceable in the z direction in the depicted system of coordinates by way of a respectively assigned supporting base 123 or 133. The bipod struts 121, 122 and 131, 132 may also be respectively designed as jointly length-adjustable within the same bipod 120 or 130. According to FIG. 1, the bipod struts 121, 122, 131, 132 of the two actuation units and also the bipod struts 111, 112 of the supporting unit are respectively articulated on the optical element 101 at a flexure point G11, G12 or G13. Of these flexure points, the flexure point G13 that is assigned to the bipod 110 forming the supporting unit is locationally fixed, since, as indicated in FIG. 1, the bipod struts 111, 112 are fixedly connected to the "fixed world" and the remaining degree of locational freedom is blocked by way of the arrangement of the (not separately length-adjustable) bipod struts 121, 122 and 131, 132 of the bipods 120 and 130, respectively.

With an arrangement according to FIG. 1, it could be achieved in principle that a translational movement or displacement of one of the two actuation units or one of the two supporting bases assigned to the bipods 120, 130 is inevitably accompanied by a tilting movement of the optical element 101 about a tilting axis (represented in FIG. 1 by dashed lines and denoted by "A1" and "A2", respectively), which is defined by the flexure points of the other actuation unit respectively and the supporting unit. In fact, a translational movement of the supporting base 123 in the z direction is accompanied by a tilting movement of the optical element 101 about the tilting axis A2, whereas a translational movement of the supporting base 133 in the z direction is accompanied by a tilting movement of the optical element 101 about the tilting axis A1. Here, the flexure point G13, at which the supporting unit 110 is articulated on the optical element 101, is locationally fixed, so that no tilting movement or rotation of the optical element 101 about the z axis takes place. For the facet mirror, having a multiplicity of optical elements 101 in the form of individual mirrors, this means that a rotation of the individual mirrors about the respective mirror axis, and an accompanying collision of the mirror elements, are reliably avoided without the need for additional blocking elements.

However, it should be noted that the element to be actuated according to the invention is an optical element 101, in particular for instance an individual mirror of a facet mirror in an illumination device of a microlithographic projection exposure apparatus, in which bipods 120 and 130 such as are shown in FIG. 1 cannot be realized for reasons of installation space alone.

Figure 2:
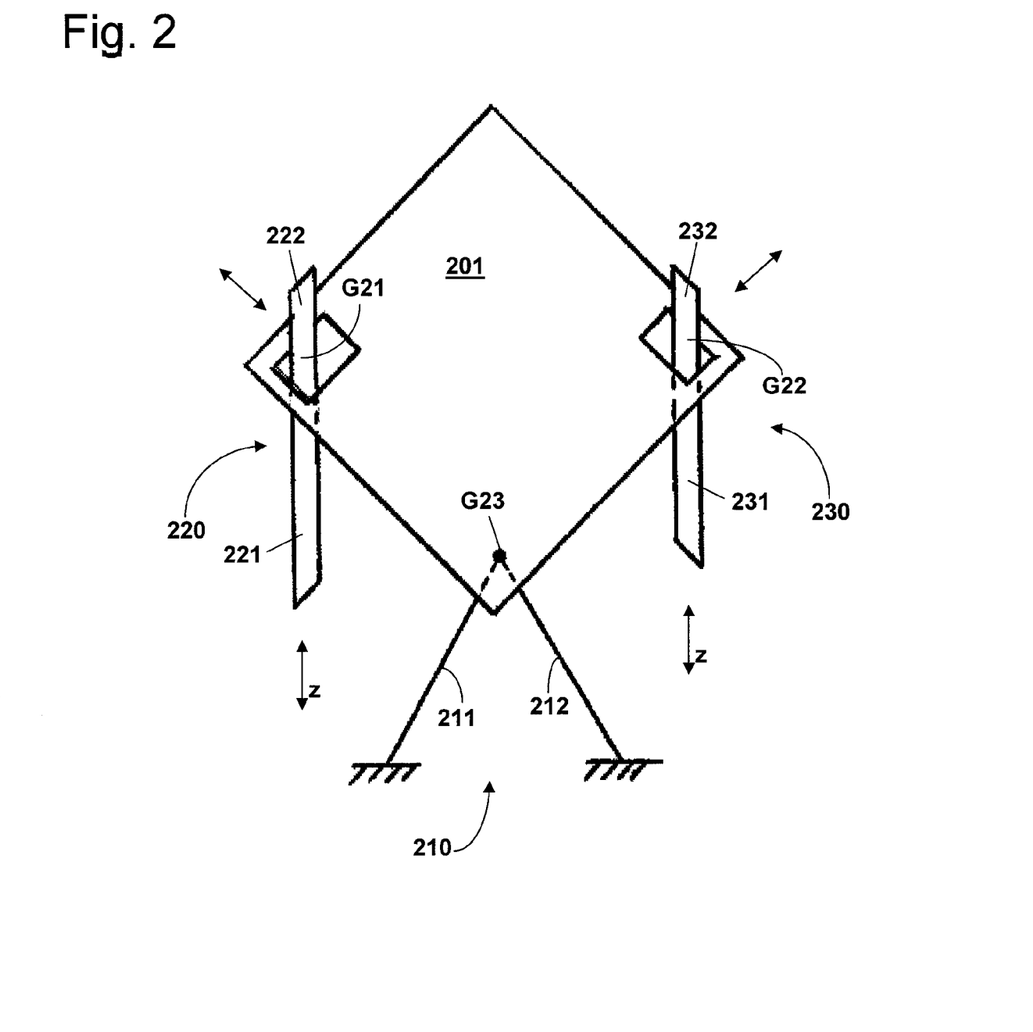
FIGS. 2-4 show schematic representations for explaining further embodiments of the invention.

FIG. 2 serves for explaining a further thought process on the way to realizing the concept according to the invention. The structure from FIG. 2 differs from that from FIG. 1 in that the two actuation units 220, 230 are not configured as bipods, but in the form of leaf spring elements 221 and 231, which respectively have a ball joint head 222 and 232, respectively, mounted in the area of the optical element 201, for providing the flexure points G21 and G22, respectively. Furthermore, by analogy with the supporting bases 123 and 133 from FIG. 1, the leaf spring elements 221 and 231 can be actuated in the z direction, for which purpose suitable actuators, such as for example Lorentz motors, may be used. As a result, the arrangement according to FIG. 2 provides the same functionality as that from FIG. 1, i.e. an actuation of the leaf spring elements 221 and 231 in the z direction is accompanied by a tilting movement of the optical element 201 about a tilting axis, which is defined by the actuating unit 220 or 230 having the other leaf spring element, respectively, and the supporting unit 210, while at the same time an undesired tilting movement about the z axis is avoided as a result of the still locally fixed flexure point G23.

However, it must also be noted that the element to be actuated according to the invention is an optical element 101 for which the area that is defined by the element 101, as the optical effective area of the element 101, is not itself mechanically accessible.

Figure 3:
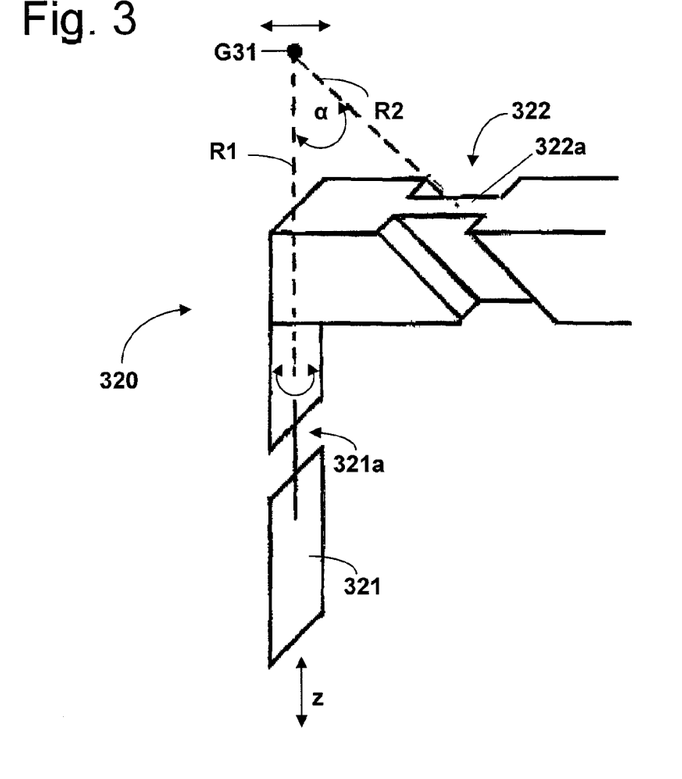

FIG. 3 then shows a schematic representation for explaining a possible realization of the concept according to the invention. This differs from that from FIG. 2 in that, in the two actuating units (220 and 230 from FIG. 2), ball joint heads are not used and instead each actuation unit (of which only one actuation unit is shown in FIG. 3) has a flexure unit 320 with in each case two flexing elements 321, 322, these flexing elements 321, 322 or the associated axes of rotation R1, R2 (represented by dashed lines in FIG. 3) jointly de-fining a virtual connecting point G31 at the position of the flexure point G11 and G12, respectively, from FIG. 1 (and consequently in the region that is mechanically not accessible).

In the exemplary embodiment of FIG. 3, the flexing element 321 is formed as a leaf spring and has a torsional functionality indicated by the double-headed arrow, whereby a first axis of rotation R1 is defined. The second flexing element 322, running in the horizontal direction, is likewise formed as a leaf spring, but is slanted to the extent that a second axis of rotation R2, defined by the second flexing element 322 or by a hinge joint 322a provided in it, runs at an angle α to the area defined by the element 101, where 0<α<90°.

Even if in the embodiment shown in FIG. 3 the required rotational functionality is realized by additional hinge joints 321a, 322a, such hinge joints are optional in principle, since in a suitable configuration true leaf springs can also already provide the rotation-al or torsional function.

As likewise represented in FIG. 3, for the respective flexure unit 320, the two associated axes of rotation R1 and R2 intersect at a virtual connecting point G31 of the flexure unit 320 concerned to the optical element 101, this virtual connecting point G31 being arranged in an area defined by the element 101 and defining a rotating point for the optical element 101. As a result, the effect of a ball joint is in this way emulated to a certain extent by the flexing elements 321, 322 of each of the two actuation units, or a "virtual ball joint" is realized, the rotating point of which lies at the position G31 in FIG. 3, the axes of rotation R1, R2 being formed by the axis of rotation R1 for the first flexing element 321 (extending vertically in FIG. 3) and by the axis of rotation R2 of the second flexing element 322 (extending horizontally in FIG. 3). In this way it is made possible to realize the tilting axes A1 and A2 in FIG. 1 in the area of the optical element 101, without a placement of the mechanical connecting points of the actuation units in the area of the optical element 101 being required for this.

In other words, in the realization of the invention according to FIG. 3, while the flexure point G31 continues to lie within the area of the optical element 101 (for example in the facet plane of the facet mirror concerned) as shown in FIG. 1, the flexing elements and the possibly associated hinge joints 321a and 322a, respectively, are arranged outside this area of the optical element 101, as can be seen from FIG. 3, so that, although as a result the effect of a ball joint is achieved, the space requirement that a ball joint involves can be avoided.

For each of the two points G11 and G12 from FIG. 1, one of which corresponds to G31 in FIG. 3, a corresponding arrangement of flexing elements as shown in FIG. 3 is thus provided in such a way that as a result two effective axes of rotation R1, R2 establish the virtual connecting point G31 or generate a rotating point, the flexing element 322 that extends horizontally according to FIG. 3 running underneath the tilting axis A1 or A2, and the flexing element 321 that extends vertically in FIG. 3 substituting the supporting base 123 or 133 in FIG. 1.

In each of the embodiments described above, the supporting unit may be configured as a bipod ("110" in FIG. 1 or "210" in FIG. 2) with two fixed struts or as a tripod with three fixed struts. Furthermore, the supporting unit concerned may be additionally used for transporting a cooling fluid to the element or mirror element concerned, for which purpose the supporting unit or the struts may respectively have one or more cooling channels.

An advantageous configuration of a guide for the flexing elements or leaf spring elements described above on the basis of FIG. 1-3 is described below with reference to FIG. 4. This guide is created in such a way that it is possible, optionally or by simply changing a parameter of the kinematics, to "switch over" between a strictly linear movement of the respective flexing element or leaf spring element (symbolized here by the point P) and a (possibly slight) arcing movement of the point P. According to FIG. 4, serving for this purpose is a flexure element 440, which is connected by an end portion to the schematically indicated "fixed world" by way of flexure struts 441, 442, which are variable in length independently of one another, and is connected by the other end portion to the point P.

Figure 4:
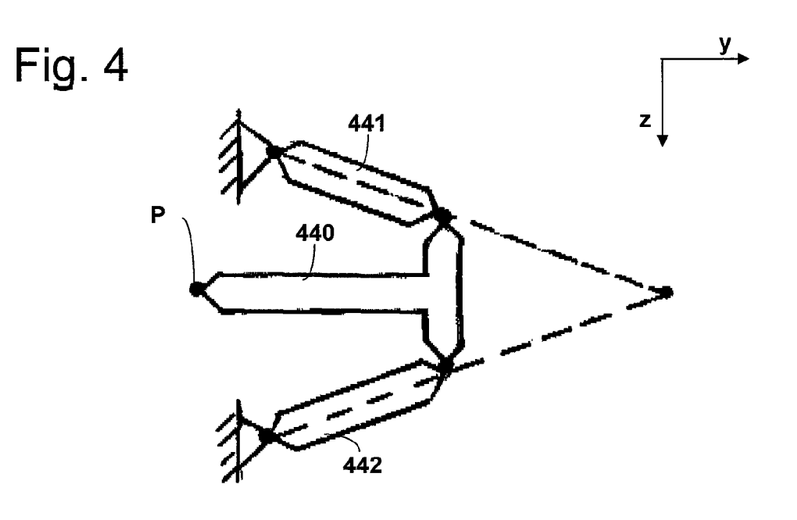

An extension or compression of the flexure struts 441 and 442 and an analogous adaptation of the element 440 in such a way as to leave the position of the point P unchanged have the consequence in the structure shown in FIG. 4 that the trajectory of the point P corresponds either to a straight movement or to an arcing movement (with a movement component in the optionally positive or negative y direction). The capability created thereby of changing over between the mentioned paths of movement of the point P or of the respective flexing element of the actuation unit has the advantage that, even after completion of the design of the respective optical system, the compensation of any existing parasitic movements can still be achieved in a simple way, without having to intervene once again in the fundamental design of the optical system. In particular, in the case where the invention is applied to an optical system in the form of a facet mirror, by this means undesired parasitic movements of the individual mirror concerned within the facet mirror can be discovered and compensated.

Figure 5:
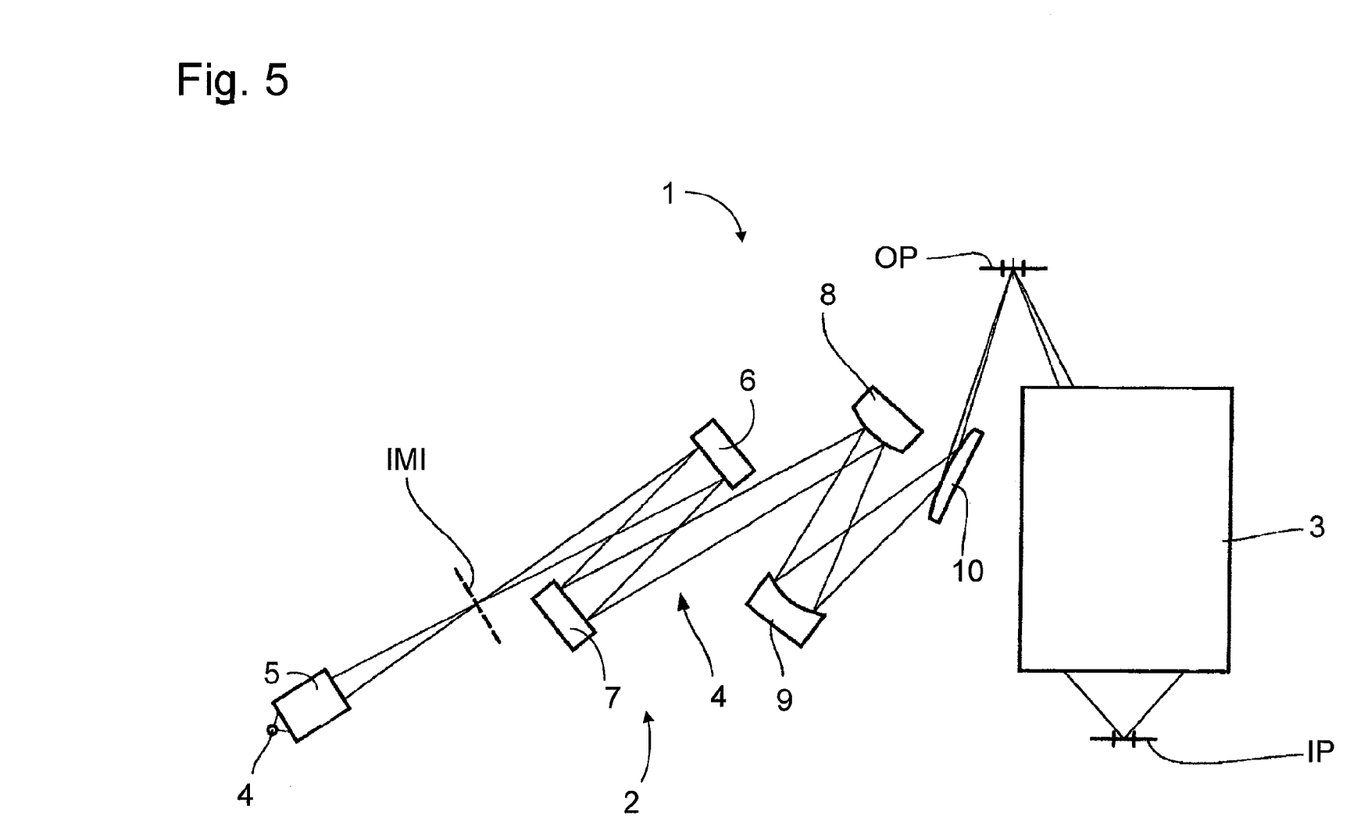
FIG. 5 shows a schematic representation of a lithographic projection exposure apparatus designed for operation in EUV.

FIG. 5 merely shows schematically the structure of a microlithographic projection exposure apparatus designed for operation in EUV, in which the present invention can be realized by way of example.

The microlithographic projection exposure apparatus 1 represented in FIG. 5 has an illumination device 2 and a projection lens 3, the illumination device illuminating an object plane OP of the projection lens 3. The EUV illumination light generated by a plasma radiation source 4 passes via a collector mirror 5 to an intermediate focusing plane IMI and from there via a field facet mirror 6, which may be configured with an arrangement for the actuation according to the embodiments described above, onto a pupil facet mirror 7. From the pupil facet mirror 7, the illumination light passes via a transfer optical system comprising mirrors 8-10 into the object plane OP, in which a mask (reticle) having structures to be depicted is formed. The mask structures are transferred via the projection lens 3 onto the light-sensitive coating of a substrate (wafer) mounted in the image plane IP of the projection lens 3.

Even though the invention has been described on the basis of specific embodiments, numerous variations and alternative embodiments are evident to a person skilled in the art, for example by combining and/or exchanging features of individual embodiments. Accordingly, it goes without saying for a person skilled in the art that such variations and alternative embodiments are also covered by the present invention, and the scope of the invention is only restricted by the constraints of the accompanying patent claims and the equivalents thereof.

The invention claimed is:

1. An arrangement, comprising:
   a first actuation unit; and
   a second actuation unit,
   wherein:
      the first and second actuation units are configured to tilt an element of an optical system about a first tilting axis and a second tilting axis which is different from the first axis;
      the first actuation unit comprises a first flexure unit arranged outside an area defined by the element;

the second actuation unit comprises a second flexure unit arranged outside the area defined by the element;

the first flexure unit comprises a first flexing element which is rotatable with respect to a first axis of rotation;

the first flexure unit comprises a second flexing element which is with respect to a second axis of rotation which is different from the first axis of rotation;

the second flexure unit comprises a third flexing element which is rotatable with respect to a third axis of rotation;

the second flexure unit comprises a fourth flexing element which is rotatable with respect to a fourth axis of rotation which is different from the third axis of rotation;

for the first flexure unit, the first and second axes of rotation intersect at a first virtual connecting point which: a) is arranged in the area defined by the element; and b) defines a first rotating point for the element; and for the second flexure unit, the third and fourth axes of rotation intersect at a second virtual connecting point which: a) is arranged in the area defined by the element; and b) defines a second rotating point for the element.

2. The arrangement of claim 1, wherein the first flexing element comprises a leaf spring element.

3. The arrangement of claim 2, wherein the second flexing element comprises a leaf spring element.

4. The arrangement of claim 3, wherein the second flexing element comprises a hinge joint.

5. The arrangement of claim 4, wherein the first flexing element comprises a first hinge joint.

6. The arrangement of claim 2, wherein the first flexing element comprises a first hinge joint.

7. The arrangement of claim 1, wherein the first flexing element comprises a first hinge joint.

8. The arrangement of claim 1, wherein the first axis of rotation is perpendicular to the area defined by the element.

9. The arrangement of claim 8, wherein the second axis of rotation is at an angle that is greater than 0° and less than 90° relative to the area defined by the element.

10. The arrangement of claim 1, wherein the first tilting axis is perpendicular to the second tilting axis.

11. The arrangement of claim 1, further comprising a supporting unit which is articulated on the element at a flexure point.

12. The arrangement of claim 11, wherein the first actuation unit, the second actuation unit and the supporting unit are configured so that a translational movement of the first actuation unit is accompanied by a tilting movement of the element about a tilting axis defined by the virtual connecting point of the second actuation unit and the flexure point of the supporting unit.

13. The arrangement of claim 12, wherein the first actuation unit, the second actuation unit and the supporting unit are configured so that a translational movement of the second actuation unit is accompanied by a tilting movement of the element about a tilting axis defined by the virtual connecting point of the first actuation unit and the flexure point of the supporting unit.

14. The arrangement of claim 11, wherein the flexure point of the supporting unit is locationally fixed.

15. The arrangement of claim 11, wherein the supporting unit comprises a bipod, and the bipod comprises two fixed struts.

16. The arrangement of claim 11, wherein the supporting unit comprises a tripod, and the tripod comprises three fixed struts.

17. The arrangement of claim 11, wherein the supporting unit comprises a channel configured to contain a cooling fluid to cool the supporting unit.

18. The arrangement of claim 1, further comprising a guide configured to guide movement of the first flexing element.

19. The arrangement of claim 18, wherein the guide is configured to guide the first flexing unit along a linear path of movement.

20. The arrangement of claim 18, the guide is configured to guide the first flexing unit along an arcuately curved path of movement.

21. The arrangement of claim 18, wherein the guide comprises two length-variable flexure struts configured to modify a path of movement of the first flexing element.

22. The arrangement of claim 1, wherein the optical system comprises a facet mirror, and the element comprises a facet of the facet mirror.

23. An apparatus, comprising:
an illumination device;
a projection lens; and
an arrangement according to claim 1,
wherein the apparatus is a projection exposure apparatus.

24. The apparatus of claim 23, wherein the apparatus is configured to have an operating wavelength of less than 15 nm.

25. A method of using a microlithographic projection exposure system comprising an illumination device and a projection lens, the method comprising:
using the illumination device to illuminate a portion of a mask; and
using the projection lens to projection at least a portion of the illuminated portion of the mask onto a light-sensitive material,
wherein the microlithographic projection exposure system comprises an arrangement according to claim 1.

26. An optical system, comprising:
a plurality of independently adjustable elements comprising a first element; and
an arrangement comprising:
a first actuation unit; and
a second actuation unit,
wherein:
the first and second actuation units are configured to tilt the first element of an optical system about a first tilting axis and a second tilting axis which is different from the first axis;
the first actuation unit comprises a first flexure unit arranged outside an area defined by the first element;
the second actuation unit comprises a second flexure unit arranged outside the area defined by the first element;
the first flexure unit comprises a first flexing element which is rotatable with respect to a first axis of rotation;
the first flexure unit comprises a second flexing element which is with respect to a second axis of rotation which is different from the first axis of rotation;
the second flexure unit comprises a third flexing element which is rotatable with respect to a third axis of rotation;

the second flexure unit comprises a fourth flexing element which is rotatable with respect to a fourth axis of rotation which is different from the third axis of rotation;

for the first flexure unit, the first and second axes of rotation intersect at a first virtual connecting point which: a) is arranged in the area defined by the first element; and b) defines a first rotating point for the first element; and for the second flexure unit, the third and fourth axes of rotation intersect at a second virtual connecting point which: a) is arranged in the area defined by the first element; and b) defines a second rotating point for the first element.

27. The optical system of claim 26, wherein the optical system comprises a facet mirror, and the first element comprises a facet of the facet mirror.

28. The optical system of claim 26, wherein the optical system is an optical system of a microlithographic projection exposure apparatus.

* * * * *

UNITED STATES PATENT AND TRADEMARK OFFICE
CERTIFICATE OF CORRECTION

PATENT NO.         : 9,651,772 B2                                        Page 1 of 1
APPLICATION NO.    : 14/795458
DATED              : May 16, 2017
INVENTOR(S)        : Markus Hauf, Martin Latzel and Edwin Johan Buis It is certified that error appears in the above-identified patent and that said Letters Patent is hereby corrected as shown below:

In the Specification

Column 1, Line 13, after "reference", insert -- . --.

Column 5, Line 23, delete "FIG. 1-3." and insert -- FIGS. 1-3. --.

Column 6, Line 60, delete "de-fining" and insert -- defining --.

Column 7, Line 11, delete "rotation-al" and insert -- rotational --.

Column 7, Line 61, delete "FIG. 1-3" and insert -- FIGS. 1-3 --.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*